United States Patent
Chu

(10) Patent No.: US 9,047,152 B2
(45) Date of Patent: Jun. 2, 2015

(54) DELAY DEVICE, METHOD, AND RANDOM NUMBER GENERATOR USING THE SAME

(71) Applicant: Skymedi Corporation, Hsinchu (TW)

(72) Inventor: Feng-Shen Chu, Hsinchu (TW)

(73) Assignee: Skymedi Corporation, Hsinchu Science Park, Hsinchu (TW)

( * ) Notice: Subject to any disclaimer, the term of this patent is extended or adjusted under 35 U.S.C. 154(b) by 327 days.

(21) Appl. No.: 13/742,357

(22) Filed: Jan. 16, 2013

(65) Prior Publication Data
US 2014/0201253 A1  Jul. 17, 2014

(51) Int. Cl.
*G06F 7/58* (2006.01)
*H03K 3/84* (2006.01)

(52) U.S. Cl.
CPC .............. *G06F 7/582* (2013.01); *G06F 7/588* (2013.01); *H03K 3/84* (2013.01)

(58) Field of Classification Search
None
See application file for complete search history.

(56) References Cited

U.S. PATENT DOCUMENTS

| | | | | |
|---|---|---|---|---|
| 2003/0236802 | A1* | 12/2003 | Epstein | 708/250 |
| 2009/0106339 | A1* | 4/2009 | Vasyltsov et al. | 708/251 |
| 2009/0248771 | A1* | 10/2009 | Vergnes et al. | 708/251 |
| 2011/0131263 | A1* | 6/2011 | Vasyltsov et al. | 708/251 |
| 2012/0233233 | A1* | 9/2012 | Chandra | 708/251 |
| 2014/0143292 | A1* | 5/2014 | Yasuda et al. | 708/251 |
| 2014/0201253 | A1* | 7/2014 | Chu | 708/250 |

* cited by examiner

*Primary Examiner* — David H Malzahn
(74) *Attorney, Agent, or Firm* — Winston Hsu; Scott Margo

(57) ABSTRACT

A delay device for generating a signal for a random component in a random number generator is disclosed. The delay device includes a delay module, for generating a plurality of delayed signals, wherein each delayed signal has a delay time and the delay time is different from each other; a first multiplexer, coupled to the delay module, for outputting a delayed signal among the plurality of delayed signals as a delayed trigger signal to control the random component to generate a random bit; and a delay selector, coupled to the first multiplexer, for generating a selecting signal to control the first multiplexer to select to output the delayed signal as the delayed trigger signal.

40 Claims, 15 Drawing Sheets

US 9,047,152 B2

DELAY DEVICE, METHOD, AND RANDOM NUMBER GENERATOR USING THE SAME

BACKGROUND OF THE INVENTION

1. Field of the Invention

The present invention relates to a delay device, method and random number generator using the same, and more particularly, to a delay device, method and random number generator capable of generating delayed input signal(s) for random component(s), in order to enhance the randomness.

2. Description of the Prior Art

A random number generator is widely used for cryptography application, to provide an unpredictable or nondeterministic value for the generation of nonce, challenge, or a key of symmetric/asymmetric cipher algorithm. The entropy source of the conventional random number generator has several random components with identical or diverse duplications, and the output of each random component can be combined to output a random result.

Conventional random components can be classified into two types: jitter-based and metastability-based. Both types of the random components can generate random bits. In general, the randomness of the random bits depends on environmental issues such as process, voltage, and temperature. For example, the overlay shifts of the process may influence the randomness. Since the overlay shifts may cause certain regularity on the performance of the random components, the random bits outputted by the random components may deviate from true randomness. Sometimes the regularity may cause the random components to generate the same bits continuously (e.g. a series of 1 or a series of 0), or cause periodicity to occur in the output random bits. As a result, the randomness will be reduced.

In order to achieve higher randomness, the entropy source of the conventional random number generator always utilizes a large quantity of random components and combines the output results of these random components. However, such a large quantity of random components may consume considerable power and large circuit area. In addition, the random components are usually implemented by using the standard logic cells based on the process, of which each of the standard logic cells possesses consistency to some extent, such that the randomness of the combinational results of the homogeneous random components may not be satisfactory. Moreover, trigger signals for the random components are always generated from the same system clock; hence periodicity of the system clock may cause the random components to have similar triggering performance. Therefore, there is a need for improvement of the prior art.

SUMMARY OF THE INVENTION

It is therefore an objective of the present invention to provide a delay device, method and random number generator using the same, which are capable of generating delayed input signal(s) for random component(s), in order to enhance the randomness.

The present invention discloses a delay device for generating a signal for a random component in a random number generator. The delay device comprises a delay module, for generating a plurality of delayed signals, wherein each delayed signal has a delay time and the delay time is different from each other; a first multiplexer, coupled to the delay module, for outputting a delayed signal among the plurality of delayed signals as a delayed trigger signal to control the random component to generate a random bit; and a delay selector, coupled to the first multiplexer, for generating a selecting signal to control the first multiplexer to select to output the delayed signal as the delayed trigger signal.

The present invention further discloses a random number generator, which comprises a random component and a delay device for generating a signal for the random component. the delay device comprises a delay module, for generating a plurality of delayed signals, wherein each delayed signal has a delay time and the delay time is different from each other; a first multiplexer, coupled to the delay module, for outputting a delayed signal among the plurality of delayed signals as a delayed trigger signal to control the random component to generate a random bit; and a delay selector, coupled to the first multiplexer, for generating a selecting signal to control the first multiplexer to select to output the delayed signal as the delayed trigger signal.

The present invention further discloses a random number generator, which comprises a plurality of random components and a delay device for generating a signal for each of the plurality of random components. The delay device comprises a delay module, for generating a plurality of delayed signals, wherein each delayed signal has a delay time and the delay time is different from each other; a plurality of first multiplexers, each coupled to the delay module, for outputting a delayed signal among the plurality of delayed signals as a delayed trigger signal to control each random component among the plurality of random components to generate a random bit; and a delay selector, coupled to the plurality of first multiplexers, for generating a selecting signal to control each of the plurality of first multiplexers to select to output the delayed signal as the delayed trigger signal.

The present invention further discloses a method of generating a signal for a random component in a random number generator. The method comprises generating a plurality of delayed signals, wherein each delayed signal has a delay time and the delay time is different from each other; and generating a selecting signal to select to output a delayed signal among the plurality of delayed signals as a delayed trigger signal to control the random component to generate a random bit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
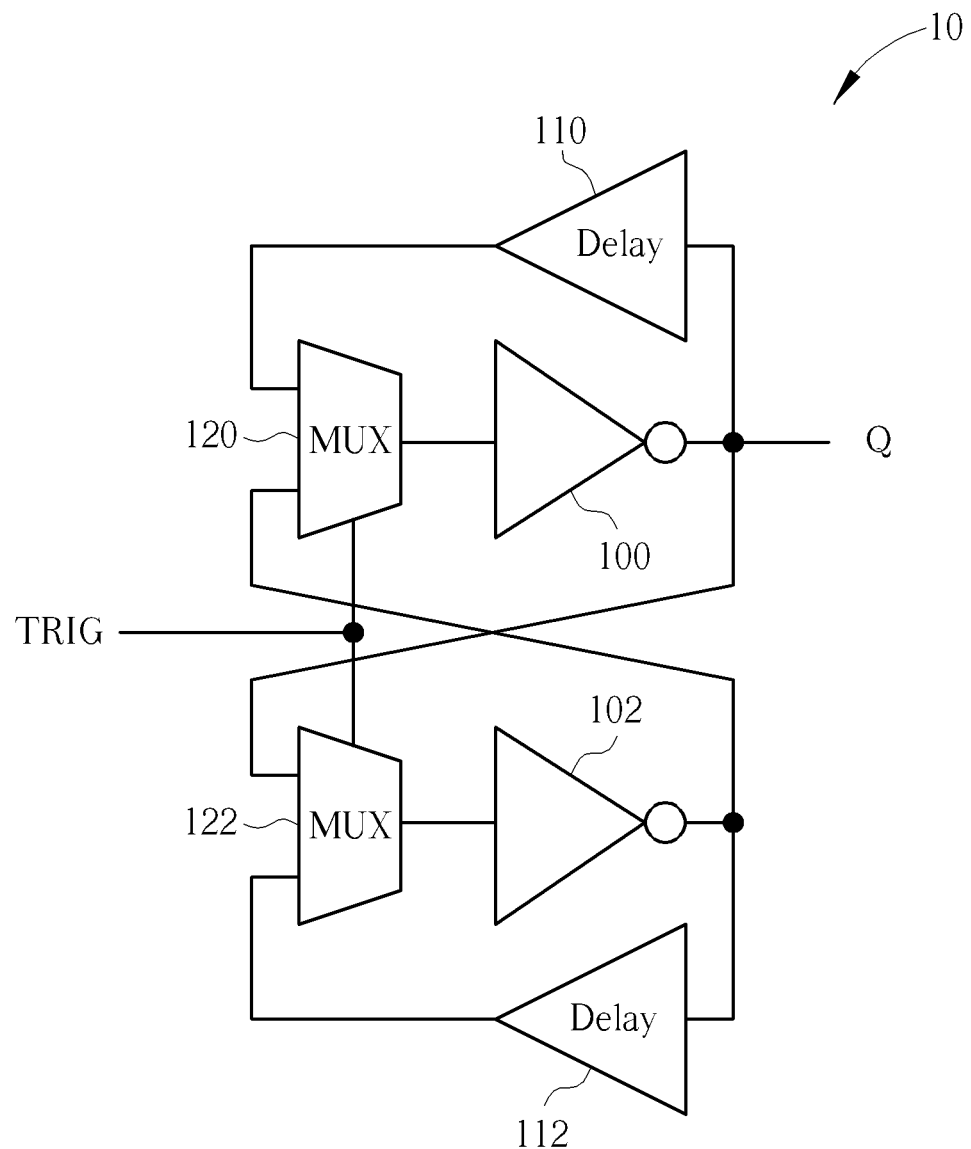
FIG. 1 is a schematic diagram of a metastability-based random component according to an embodiment of the present invention.

The present invention is realized for the random components. Among the abovementioned two types of the random components, the metastability-based random component consumes fewer circuit elements and less power, and can be realized more easily than the jitter-based random component such as ring oscillator. Therefore, the metastability-based random components are preferably realized in the entropy source of the random number generator. Please refer to FIG. 1, which is a schematic diagram of a metastability-based random component 10 according to an embodiment of the present invention. The metastability-based random component 10 is realized by using a dual single-inverter cross-feedback circuit, which includes inverters 100, 102, delay cells 110, 112, and multiplexers 120, 122. As shown in FIG. 1, an input terminal of the delay cell 110 is coupled to an output terminal of the inverter 100, and an input terminal of the delay cell 112 is coupled to an output terminal of the inverter 102. Both of the multiplexers 120, 122 have two input terminals, one output terminal, and one control terminal. In the multiplexer 120, one of the input terminals is coupled to an output terminal of the delay cell 110, the other one is coupled to the output terminal of the inverter 102, the output terminal is coupled to an input terminal of the inverter 100, and the control terminal receives a trigger signal TRIG. In the multiplexer 122, one of the input terminals is coupled to an output terminal of the delay cell 112, the other one is coupled to the output terminal of the inverter 100, the output terminal is coupled to an input terminal of the inverter 102, and the control terminal receives the trigger signal TRIG.

Figure 2A:
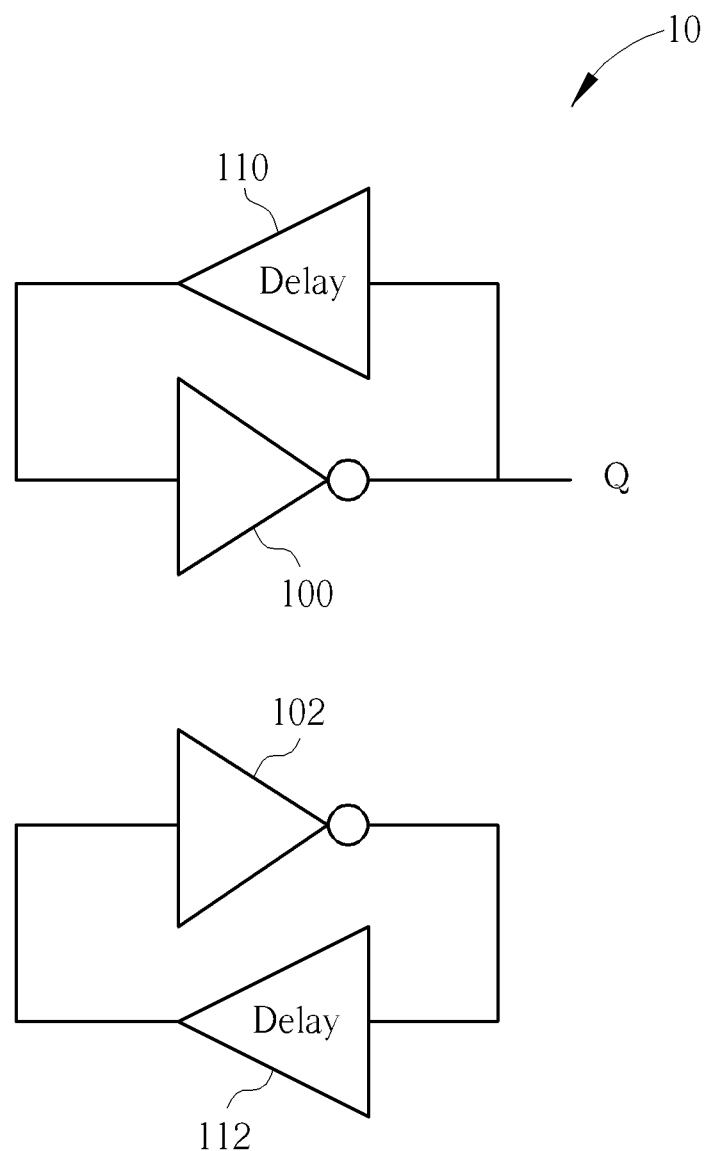
FIG. 2A is a schematic diagram of an equivalent circuit of the metastability-based random component in the oscillation mode.
Figure 2B:
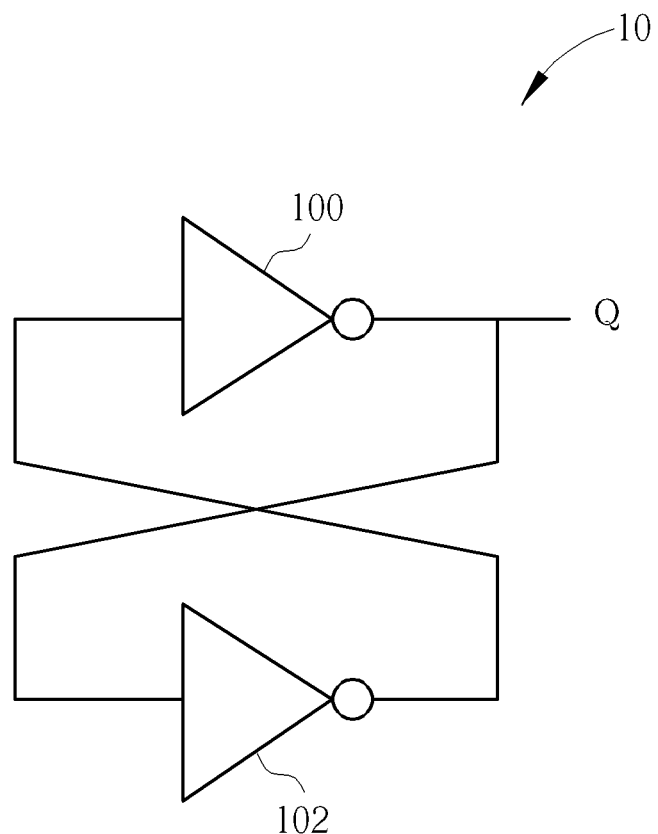
FIG. 2B is a schematic diagram of an equivalent circuit of the metastability-based random component in the resolution mode.

Please keep referring to FIG. 1. The trigger signal TRIG controls both of the multiplexers 120, 122 simultaneously, to switch the random component 10 between an oscillation mode and a resolution mode. For example, when the trigger signal is "1", the multiplexer 120 may couple the output terminal of the delay cell 110 to the input terminal of the inverter 100, and the multiplexer 122 may couple the output terminal of the delay cell 112 to the input terminal of the inverter 102. At this moment, the random component 10 is in the oscillation mode. Please refer to FIG. 2A, which is a schematic diagram of an equivalent circuit of the metastability-based random component 10 in the oscillation mode. As shown in FIG. 2A, the random component 10 can be simplified as two ring oscillators. An output signal Q can be an output of one of the inverters 100, 102, which oscillates between "1" and "0" in the oscillation mode. On the other hand, when the trigger signal is "0", the multiplexer 120 may couple the output terminal of the inverter 102 to the input terminal of the inverter 100, and the multiplexer 122 may couple the output terminal of the inverter 100 to the input terminal of the inverter 102. At this moment, the random component 10 is in the resolution mode. Please refer to FIG. 2B, which is a schematic diagram of an equivalent circuit of the metastability-based random component 10 in the resolution mode. As shown in FIG. 2B, the random component 10 can be simplified as two inverters coupled in a cross-feedback manner. The output signal Q tends to an output value "1" or "0" randomly in the resolution mode.

Figure 3:
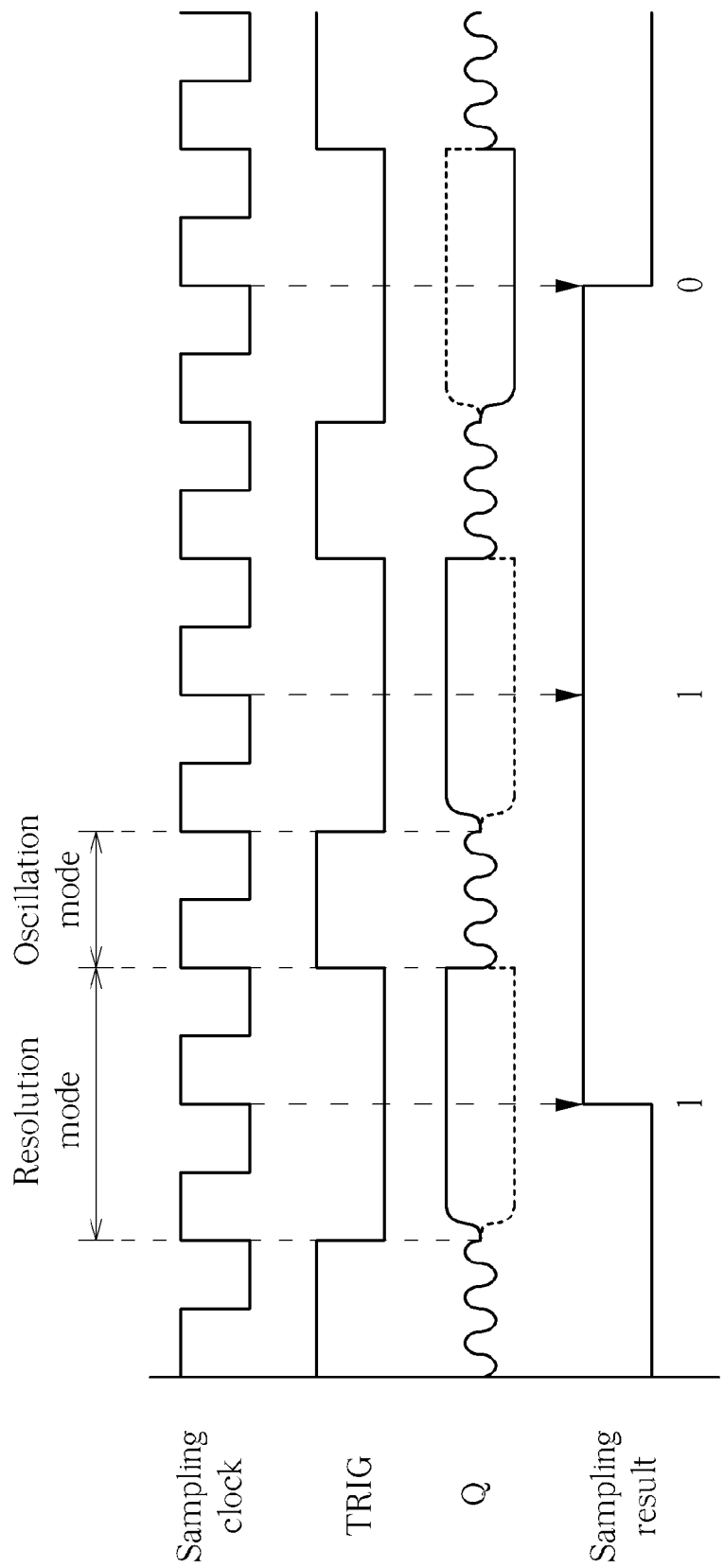
FIG. 3 is a waveform diagram of the metastability-based random component according to an embodiment of the present invention.

Please refer to FIG. 3, which is a waveform diagram of the metastability-based random component 10 according to an embodiment of the present invention. As shown in FIG. 3, when the trigger signal TRIG is "1", the random component 10 is in the oscillation mode and the output signal Q oscillates. When the trigger signal TRIG changes to "0", the multiplexers 120, 122 are triggered by the trigger signal TRIG, such that the random component 10 enters the resolution mode and the output signal Q tends to an output value "1" or "0". The output signal Q is then sampled by a sampling clock, to output the sampling result as an output random bit of the random component 10. As shown in FIG. 3, the output signal Q is sampled at one clock after the random component 10 enters the resolution mode, but in other embodiments, the sampling time can be any time as long as the random component 10 is in the resolution mode and the output signal Q becomes stable, which is not limited herein.

Figure 4A:
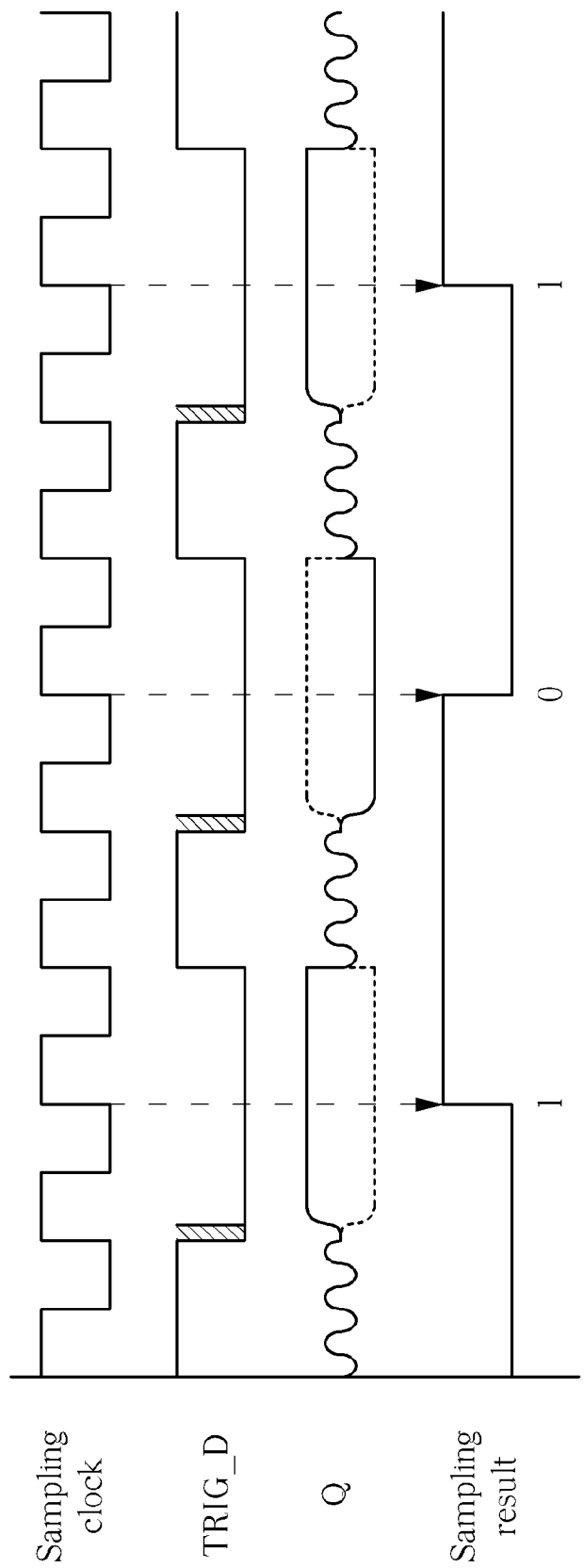
FIG. 4A is a waveform diagram of the metastability-based random component with the delayed trigger signal.

However, as illustrated above, the randomness of the random component is influenced by the environmental issues such as process, voltage and temperature, such that the output random bits of the random component may deviate from true randomness. In order to enhance the randomness, the trigger signal TRIG can be delayed by different times to trigger the multiplexers 120, 122 at different time points. The waveform of the metastability-based random component 10 with the delayed trigger signal TRIG_D is illustrated in FIG. 4A. As shown in FIG. 4A, the delayed trigger signal TRIG_D changes from "1" to "0" at different time points, i.e. the delayed trigger signal TRIG_D triggers the random component 10 at different time points. The random component 10 changes from the oscillation mode to the resolution mode at different time points, such that the output signal Q changes from oscillation to a fixed output value "1" or "0" in different conditions, which enhances the randomness of the value generated in the output signal Q when the random component enters the resolution mode.

Figure 4B:
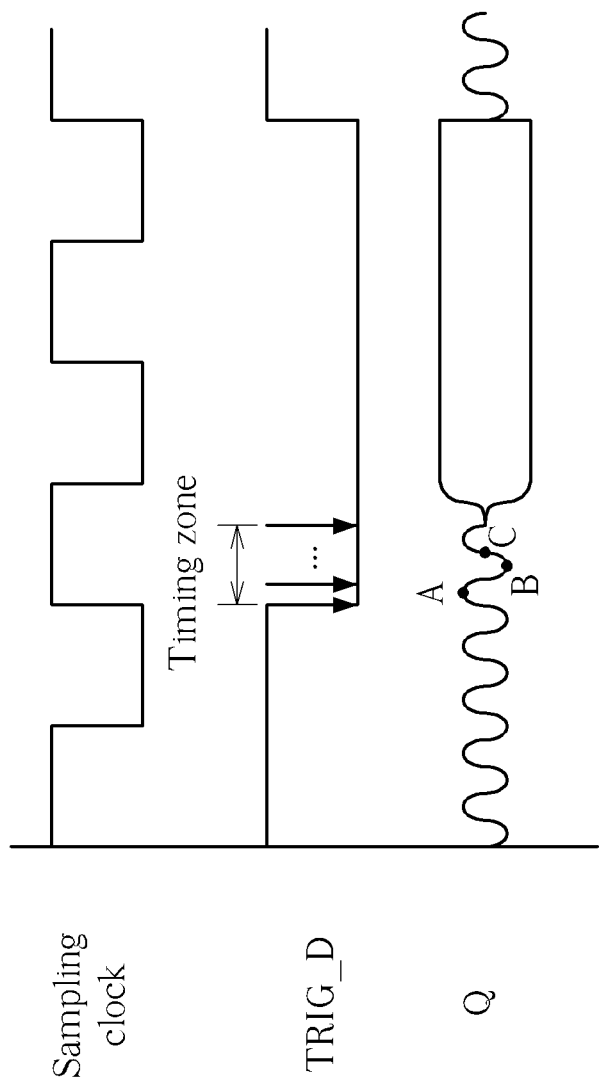
FIG. 4B is a detailed illustration of the waveform diagram shown in FIG. 4A.
Figure 5:
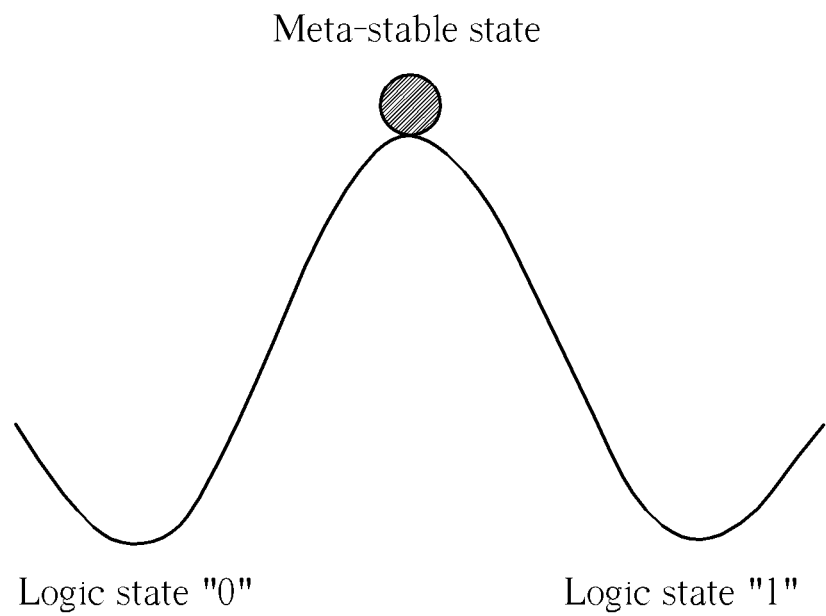
FIG. 5 is a schematic diagram of a meta-stable state according to an embodiment of the present invention.

More specifically, please refer to FIG. 4B, which is a detailed illustration of the waveform diagram shown in FIG. 4A. The waveform in FIG. 4B further illustrates the detail of the sampling clock, the delayed trigger signal TRIG_D, and the output signal Q. As shown in FIG. 4B, the delayed trigger signal TRIG_D can trigger the random component 10 to change from the oscillation mode to the resolution mode at different time points among a spread of timing zone by delaying the original trigger signal TRIG by a spread of time. If the random component 10 is triggered at a point A, where the output signal Q oscillates to a higher voltage, the random component 10 may probably tend to the output value "1". If the random component 10 is triggered at a point B, where the output signal Q oscillates to a lower voltage, the random component 10 may probably tend to the output value "0". If the random component 10 is triggered at a point C, where the output signal Q oscillates to a middle voltage, the random component 10 may tend to the output value "1" or "0" with similar probability. The point C can be considered as a meta-stable state, as illustrated in FIG. 5, which is a schematic diagram of a meta-stable state according to an embodiment of the present invention. When the random component 10 is triggered at the point C, the performance is just like a bell-shaped curve and a ball is placed on the top of the bell. The ball may stay at the top of the bell for a few time, and then tend to fall toward right (logic state "1") or left (logic state "0") randomly. Therefore, the high randomness can be achieved based on not only the uncertainty of the trigger point among the spread of timing zone, but also the uncertainty of the meta-stable performance.

Figure 6:
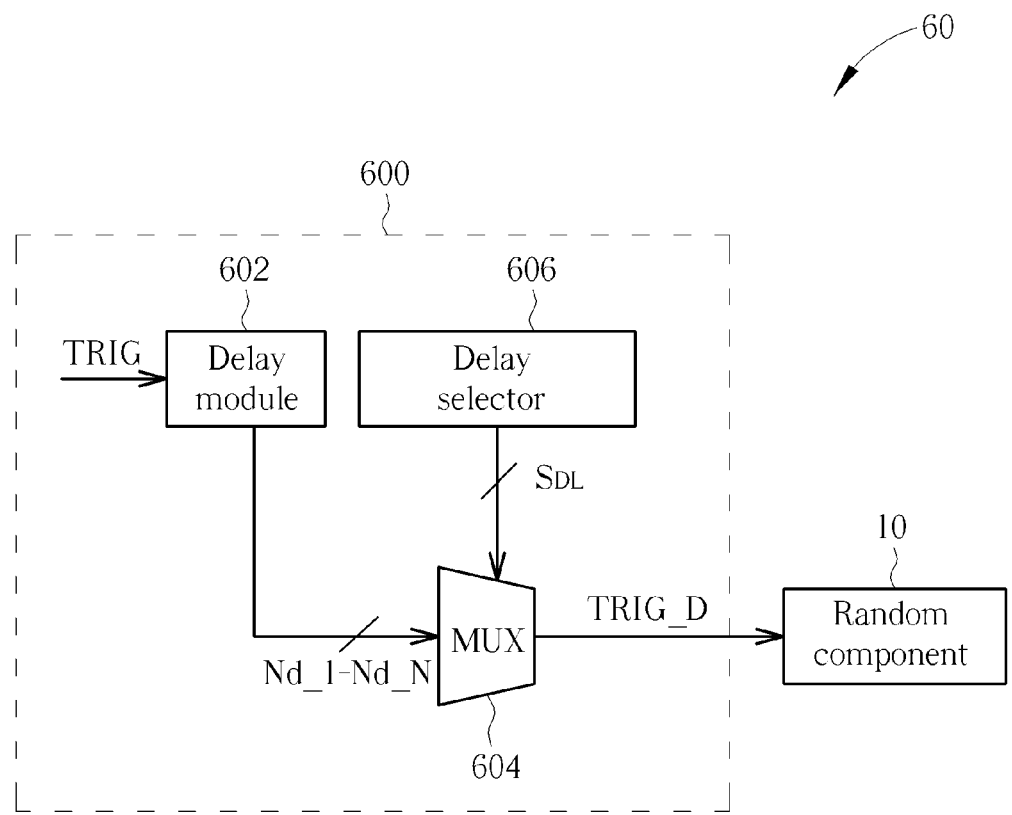
FIG. 6 is a schematic diagram of a delay device together with the random component according to an embodiment of the present invention.

The different delay time with the delayed trigger signal TRIG_D can be realized by utilizing a delay device. Please refer to FIG. 6, which is a schematic diagram of a delay device 600 together with the random component 10 according to an embodiment of the present invention. The delay device 600, which can generate a signal for the random component 10, includes a delay module 602, a multiplexer 604, and a delay selector 606. The delay module 602 is utilized for generating N delayed signals Nd_1-Nd_N, where N can be any positive integer greater than 1. Each of the delayed signals Nd_1-Nd_N has a delay time greater than or equal to zero, and the delay time is different from each other. The multiplexer 604, coupled to the delay module 602, is utilized for outputting a delayed signal among the delayed signals Nd_1-Nd_N as a delayed trigger signal TRIG_D to control the random component 10 to generate a random bit. The delay selector 606, coupled to the multiplexer 604, is utilized for generating a selecting signal $S_{DL}$ to control the multiplexer 604 to select to output the delayed signal as the delayed trigger signal TRIG_D.

In detail, when the random component 10 is required to generate a random bit, the trigger signal TRIG do not trigger the random component 10 directly; instead, the trigger signal TRIG is received by the delay module 602 of the delay device 600 first. The delay module 602 receives the trigger signal TRIG and delays the trigger signal TRIG for a spread of delay times to generate the delayed signals Nd_1-Nd_N, of which the delay times are greater than or equal to zero and different from each other. The delayed signals Nd_1-Nd_N are then received by N input terminals of the multiplexer 604. The delay selector 606 generates the selecting signal $S_{DL}$ to control the multiplexer 604 to select one of the delayed signals Nd_1-Nd_N, and then the multiplexer 604 outputs the selected delayed signal as the delayed trigger signal TRIG_D. The random component 10 receives the delayed trigger signal TRIG_D and changes from the oscillation mode to the resolution mode to generate the random bit. Since the delay time of the possible delayed trigger signal TRIG_D may possess a certain variation, the random bit may possess certain randomness.

In some embodiments, the delay device 600 together with the random component 10 can construct a random number generator 60, since the random bit outputted by the random number generator 60 may possess enough randomness. For the system application, the random number generator 60 is always utilized for generating a random bit sequence with a predefined length. Therefore, a determining unit can be utilized in the random number generator 60 for determining whether a number of random bits generated by the random number generator 60 reaches the predefined length, i.e. the predefined number of random bits required to be generated. Each time when a random bit sequence is required by the system, the trigger signal TRIG is delayed by the delay device 600 and then a delayed trigger signal TRIG_D with a variable delay time triggers the random component 10 from the oscillation mode to the resolution mode to generate a random bit. The determining unit then determines whether the number of random bits generated by the random number generator 60 reaches the predefined length. If the determining unit determines the number of random bits generated by the random number generator 60 does not reach the predefined length, the trigger signal TRIG is delayed and the delayed trigger signal TRIG_D triggers the random component 10 again to generate another random bit. If the determining unit determines the number of random bits generated by the random number generator 60 reaches the predefined length, the process of generating the random bit sequence is complete.

For generating the random sequence with higher randomness, the number of the delayed signals Nd_1-Nd_N should be large enough. More specifically, the number N should be large enough for the delay selector 606 to select to generate the random bit sequence, in order to make sure each random bit among the random bit sequence can be corresponding to a delayed signal different from each other among the delayed signals Nd_1-Nd_N, such that the higher randomness can be achieved. In general, the greater the number of the delayed signals Nd_1-Nd_N, the higher the randomness. From another perspective, if the length of the random bit sequence required to be generated by the random number generator 60 is longer, more delayed signals Nd_1-Nd_N should be required for the random number generator 60 to achieve the higher randomness.

For a random bit sequence, the delay selector 606 can control the multiplexer 604 to select the delayed signals Nd_1-Nd_N in any orders. For example, the delayed signals Nd_1-Nd_N may be selected in a direct order, i.e. Nd_1, Nd_2, Nd_3 . . . . This selecting method can be realized by using a counter, such as an up/down counter, a ring counter, a Johnson counter, or a Gray-code counter. The counter is utilized in the delay selector 606 for generating the selecting signal $S_{DL}$ in an order according to the type of the counter. The selecting signal $S_{DL}$ may be realized by a binary signal with $\log_2$ (N) bits, which can control the multiplexer 604 to select between N delayed signals. If the delay selector 606 is realized by a counter, the selecting signal $S_{DL}$ can be considered as the output of the counter, which causes the delayed signals Nd_1-Nd_N to be selected in an order according to the type of the counter. The structure of the counter is simple, such that power consumption and circuit area of the delay device 600 can be saved.

In order to generate the random sequence with higher randomness, the delayed signals Nd_1-Nd_N can be selected in a more complex manner. For example, the delayed signals Nd_1-Nd_N may be selected in a pseudo-random sequence. This selecting method can be realized by using a linear feedback shift register (LFSR), which is utilized in the delay selector 606 for generating the selecting signal $S_{DL}$ in a pseudo-random sequence. In some embodiments, the random number generator 60 further includes a random number generator control unit (not illustrated), for generating a seed for the delay selector 606 to generate the selecting signal $S_{DL}$, and generating the trigger signal TRIG for the delay module 602. The seed can initialize the counter or the LFSR utilized in the delay selector 606. Each time when a random bit sequence is required by the system and the random number generator 60 is enabled, the random number generator control unit can generate different seeds to initialize the counter or the LFSR, which enhances the randomness of the random number generator 60.

Figure 7:
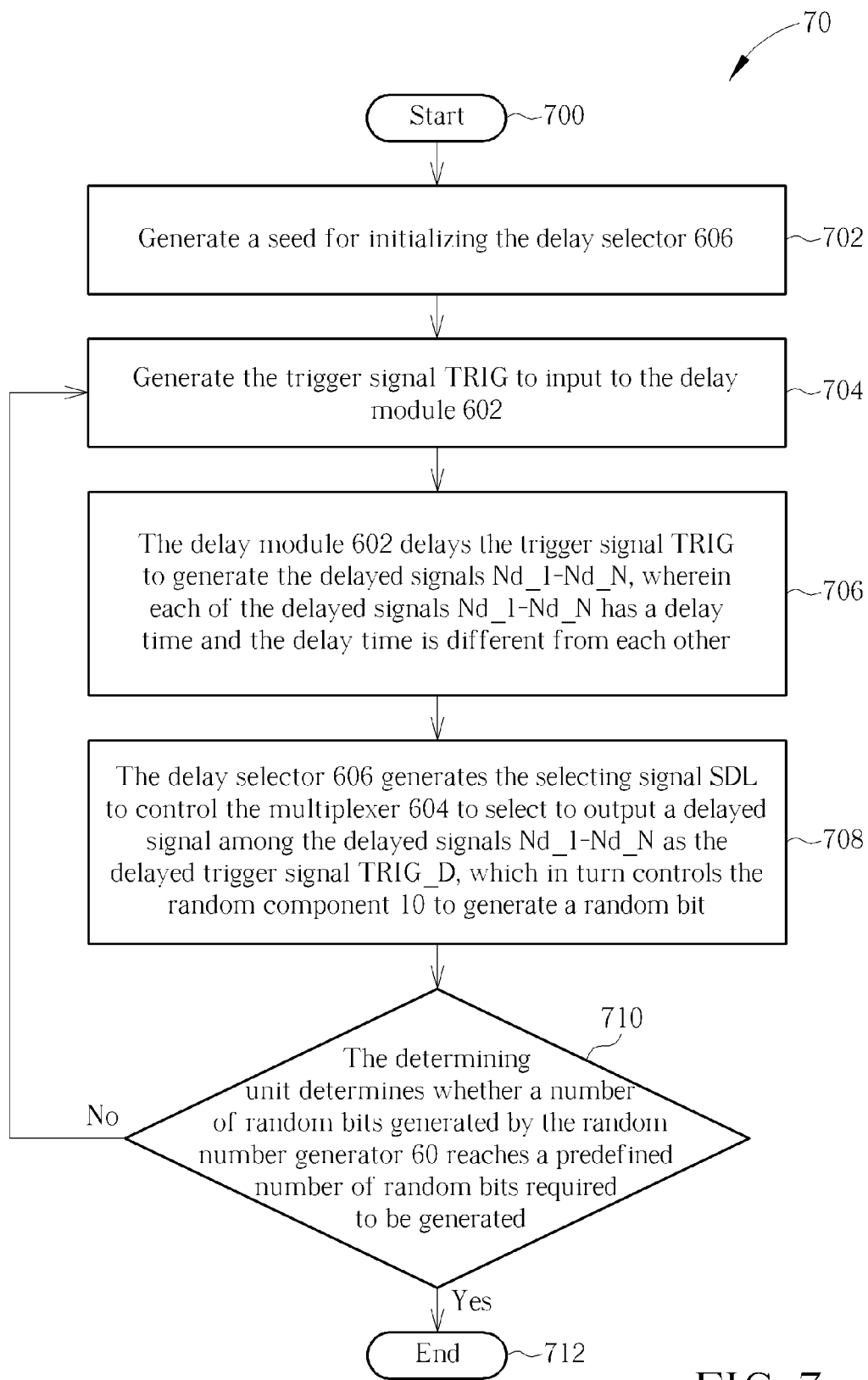
FIG. 7 is a schematic diagram of a random number generating process according to an embodiment of the present invention.

The above operations of the random number generator 60 can be summarized into a random number generating process 70. As shown in FIG. 7, the random number generating process 70 includes the following steps:

Step 700: Start.

Step 702: Generate a seed for initializing the delay selector 606.

Step 704: Generate the trigger signal TRIG to input to the delay module 602.

Step 706: The delay module 602 delays the trigger signal TRIG to generate the delayed signals Nd_1-Nd_N, wherein each of the delayed signals Nd_1-Nd_N has a delay time and the delay time is different from each other.

Step 708: The delay selector 606 generates the selecting signal $S_{DL}$ to control the multiplexer 604 to select to output a delayed signal among the delayed signals Nd_1-Nd_N as the delayed trigger signal TRIG_D, which in turn controls the random component 10 to generate a random bit.

Step 710: The determining unit determines whether a number of random bits generated by the random number generator 60 reaches a predefined number of random bits required to be generated. If yes, execute Step 712; otherwise, execute Step 704.

Step 712: End.

In some embodiments, the selection of the delayed signals Nd_1-Nd_N may be controlled by previous random bit(s) outputted by the random number generator 60 or other entropy sources. This selection method can be controlled by a previous random bit or a combination of several previous random bits outputted by the random number generator 60 or other entropy sources. For example, the random number generator control unit or the delay selector 606 may receive the output signal Q of the random component 10, and generate the selecting signal $S_{DL}$ according to the output signal Q or a combination of all of the output signals Q received previously. As a result, the selecting signal $S_{DL}$ can control the multiplexer 604 to select the delayed signals Nd_1-Nd_N in a true random sequence, which further enhances the randomness of the random number generator 60.

Figure 8:
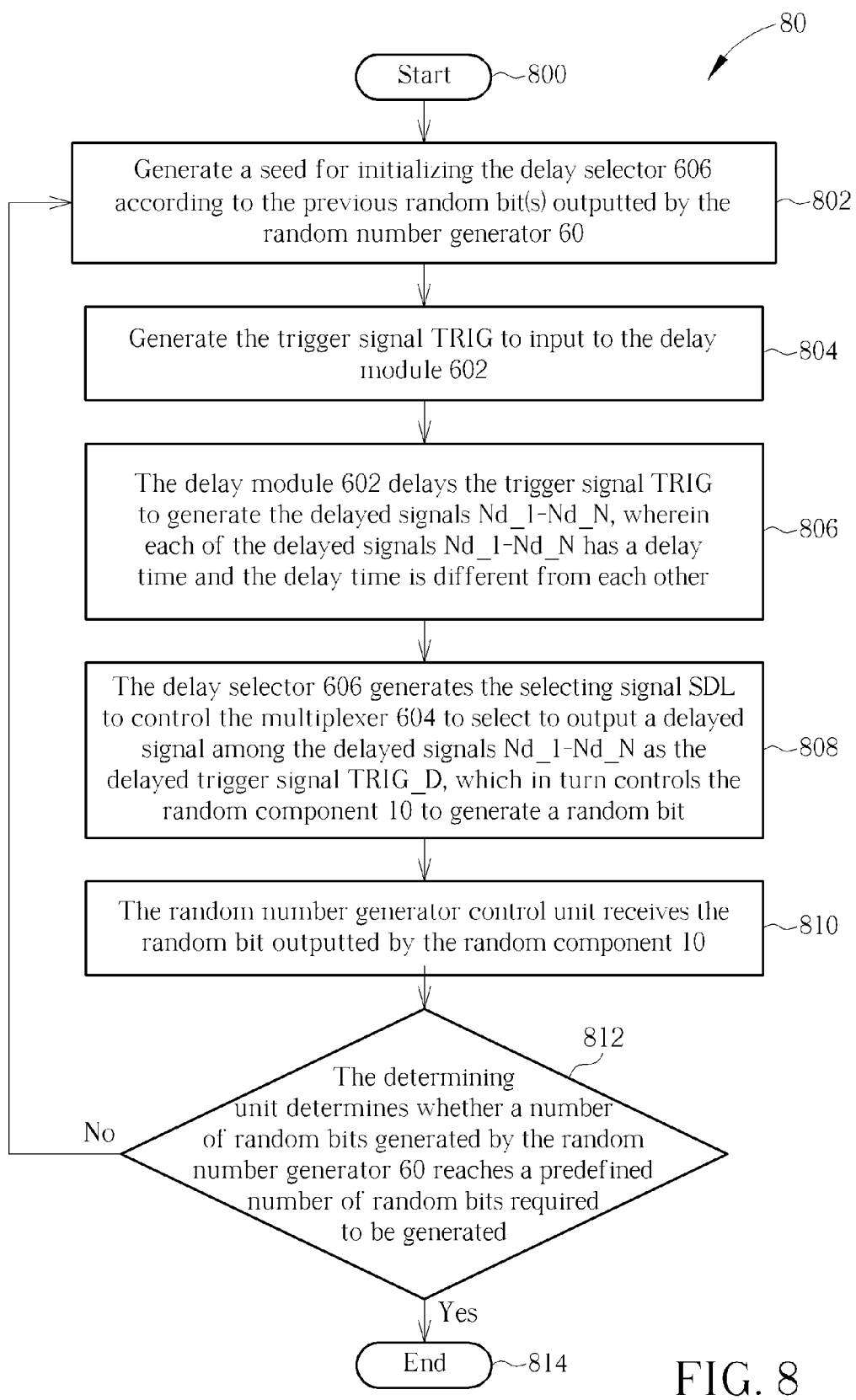
FIG. 8 is a schematic diagram of another random number generating process according to an embodiment of the present invention.

The above operations of the random number generator 60 in which the selection of the delayed signals Nd_1-Nd_N is controlled by previous random bit(s) can be summarized into a random number generating process 80, which is slightly different from the random number generating process 70. As shown in FIG. 8, the random number generating process 80 includes the following steps:

Step 800: Start.

Step 802: Generate a seed for initializing the delay selector 606 according to the previous random bit(s) outputted by the random number generator 60.

Step 804: Generate the trigger signal TRIG to input to the delay module 602.

Step 806: The delay module 602 delays the trigger signal TRIG to generate the delayed signals Nd_1-Nd_N, wherein each of the delayed signals Nd_1-Nd_N has a delay time and the delay time is different from each other.

Step 808: The delay selector 606 generates the selecting signal $S_{DL}$ to control the multiplexer 604 to select to output a delayed signal among the delayed signals Nd_1-Nd_N as the delayed trigger signal TRIG_D, which in turn controls the random component 10 to generate a random bit.

Step 810: The random number generator control unit receives the random bit outputted by the random component 10.

Step 812: The determining unit determines whether a number of random bits generated by the random number generator 60 reaches a predefined number of random bits required to be generated. If yes, execute Step 814; otherwise, execute Step 802.

Step 814: End.

In order to achieve a much higher randomness, a random number generator can utilize multiple random components together with a delay device, and each of the random bits generated by the random components can be combined to generate another random bit with higher randomness (e.g. by using exclusive-or logic). Please refer to FIG. 9, which is a schematic diagram of a random number generator 90 according to an embodiment of the present invention. The random number generator 90 includes a delay device 900 and random components 950_1-950_X. The delay device 900 includes a delay module 902, multiplexers 904_1-904_X, and a delay selector 906. The structures and functions of the delay module 902 and the delay selector 906 are similar to those of the delay module 602 and the delay selector 606, respectively, and each of the multiplexers 904_1-904_X is similar to the multiplexer 604; hence signals related to these modules are denoted by the same symbols. In practice, a random number generator with multiple random components can also be realized by copying the random number generator 60 with multiple duplicates. However, combining more random number generators may generate more power consumption and larger circuit area. In comparison, the random number generator 90 only uses one delay module 902 and one delay selector 906, which reduces power consumption and circuit area substantially.

The main difference between the random generator 90 and the random number generator 60 is that the random generator 90 has X pieces of random components 950_1-950_X. Each random component needs to receive a delayed trigger signal; hence X pieces of multiplexers 904_1-904_X are required for generating X delayed trigger signals corresponding to the X pieces of random components 950_1-950_X. Besides, the random number generator 90 further includes a random number generator control unit 910, for generating a seed for initializing the delay selector 906 to generate the selecting signal $S_{DL}$. The random number generator control unit 910 may further generate the trigger signal TRIG to input to the delay module 902.

In detail, when the random component 90 is required to generate a random bit, the trigger signal TRIG is received by the delay module 902 first. The delay module 902 receives the trigger signal TRIG and delays the trigger signal TRIG for a spread of delay times to generate the delayed signals Nd_1-Nd_N, of which the delay time is greater than or equal to zero and different from each other. The delayed signals Nd_1-Nd_N are then received by N input terminals of each of the multiplexers 904_1-904_X. The delay selector 906 utilizes the selecting signal $S_{DL}$ for controlling each of the multiplexers 904_1-904_X to select one of the delayed signals Nd_1-Nd_N, and then each of the multiplexers 904_1-904_X outputs the selected delayed signal as the corresponding delayed trigger signal among the delayed trigger signals TRIG_D1-TRIG_DX. Each of the random components 950_1-950_X receives the corresponding delayed trigger signal among the delayed trigger signals TRIG_D1-TRIG_DX and changes from the oscillation mode to the resolution mode to generate the random bit. Since the delay time of the possible delayed trigger signal TRIG_D may possess a certain variation, the random bit may possess certain randomness. In addition, the X pieces of random bits generated by the random components 950_1-950_X can be combined to generate another random bit with higher randomness (e.g. by using exclusive-or logic) as the output random bit of the random number generator 90, which further enhances the randomness.

Please note that, the different delayed trigger signals TRIG_D1-TRIG_DX may be selected in different manners by each of the multiplexers 904_1-904_X. In some embodiments, the multiplexers 904_1-904_X can be coupled to the delay module 902 in different manners, in order to select the delayed trigger signals TRIG_D1-TRIG_DX in different manners. In other words, the wire connections between the delay module 902 and the different multiplexers 904_1-904_X may be different. For example, the wire connections between the delay module 902 and the input terminals of the multiplexer 904_1 may be implemented in an order of the delayed signals Nd_1, Nd_2, Nd_3 . . . , Nd_N, the wire connections between the delay module 902 and the input terminals of the multiplexer 904_2 may be implemented in an order of the delayed signals Nd_2, Nd_3 . . . , Nd_N, Nd_1, the wire connections between the delay module 902 and the input terminals of the multiplexer 904_3 may be implemented in an order of the delayed signals Nd_3, Nd_4 . . . , Nd_N, Nd_1, Nd_2, and so on. The different wire connections make the multiplexers 904_1-904_X select different delayed signals Nd_1-Nd_N with different delay times when receiving the same selecting signal $S_{DL}$, which enhances the randomness of the random number generator 90 much more. In some embodiments, the wire connection between the delay module 902 and a multiplexer among the multiplexers 904_1-904_X can be arranged in other manners or even disarranged. Furthermore, selecting the different delayed trigger signals TRIG_D1-TRIG_DX may also be realized by utilizing different multiplexers or receiving different selecting signals by the multiplexers 904_1-904_X, which is not limited herein.

Figure 9A:
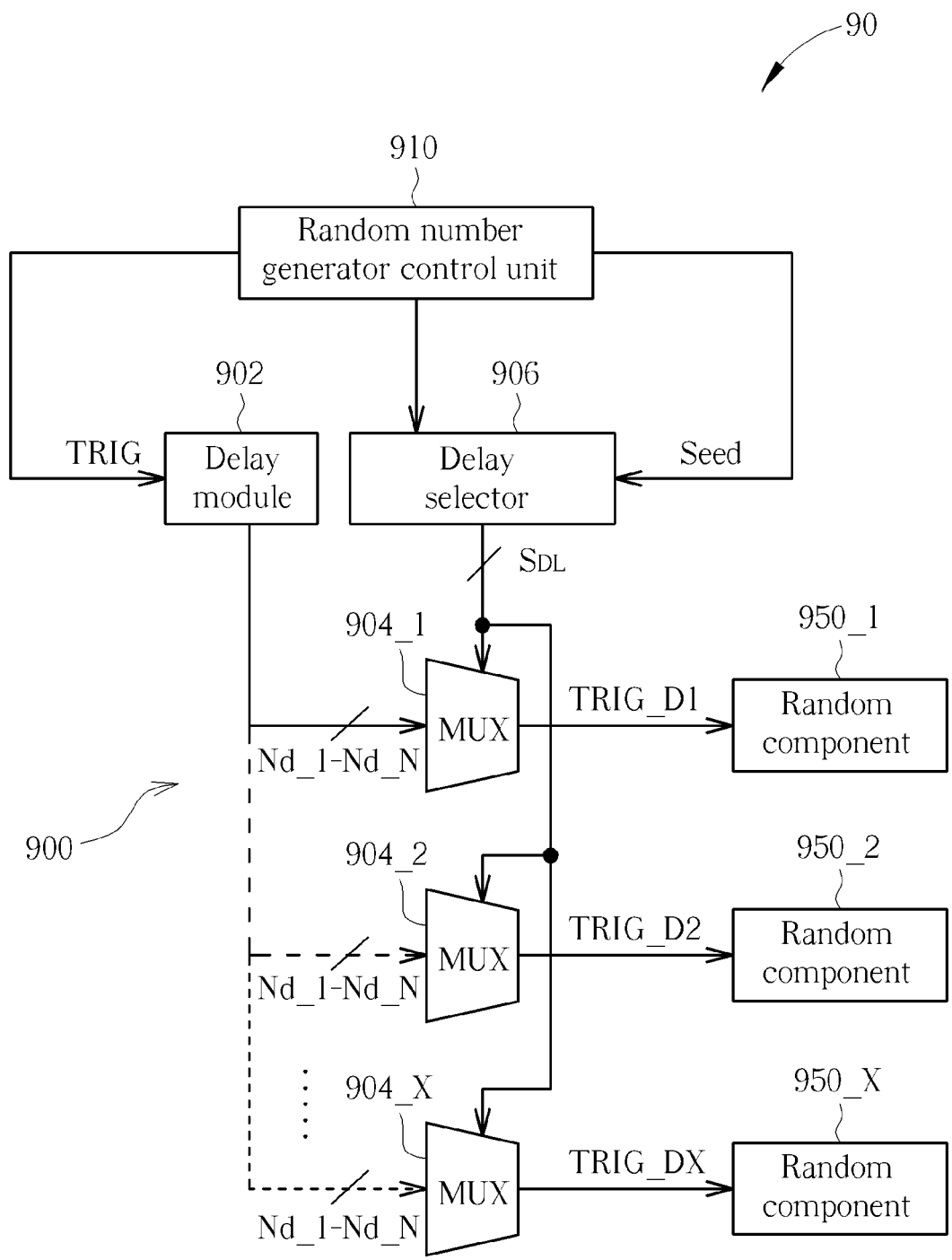
FIG. 9A is a schematic diagram of a random number generator according to an embodiment of the present invention.
Figure 9B:
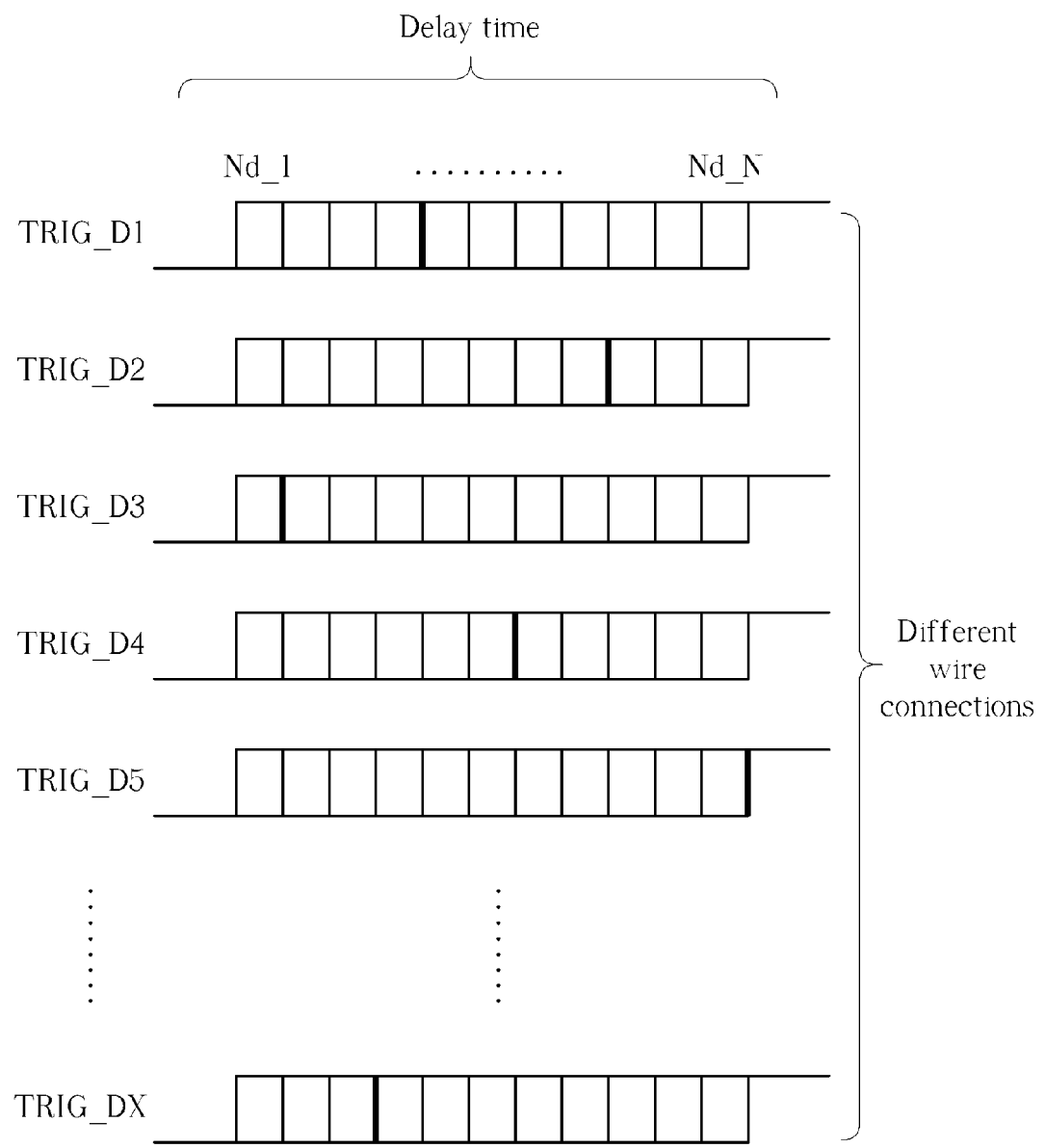
FIG. 9B is a detailed illustration of the delayed trigger signals shown in FIG. 9A.

Please refer to FIG. 9B, which is a detailed illustration of the delayed trigger signals TRIG_D1-TRIG_DX shown in FIG. 9A. As shown in FIG. 9B, enhancement of the randomness of the random number generator 90 is illustrated. In detail, for generating each of the delayed trigger signals TRIG_D1-TRIG_DX, a delayed signal among the delayed signals Nd_1-Nd_N is selected; hence the delay time of each of the delayed trigger signals TRIG_D1-TRIG_DX possesses a certain variation with a range within the delay times of the delayed signals Nd_1-Nd_N, which possess certain randomness. For each of the delayed trigger signals TRIG_D1-TRIG_DX, the randomness is achieved based on the uncertainty of the trigger point among the spread of delay times. In addition, extra randomness can be achieved based on the difference of the wire connections between the delay module 902 and the multiplexers 904_1-904_X, which causes the multiplexers 904_1-904_X to select different delayed signals Nd_1-Nd_N with different delay times when receiving the same selecting signal $S_{DL}$, in order to generate the delayed trigger signals TRIG_D1-TRIG_DX with different delay times. The X random bits then can be combined to generate a random bit with higher randomness. In such a condition, if the horizontal line represents the randomness based on the uncertainty of the delay time and the vertical line represents the randomness based on the different wire connections, the higher randomness can be achieved by combining the randomness corresponding to both the horizontal line and the vertical line. In other words, the randomness corresponding to the horizontal line and the randomness corresponding to the vertical line are joined together, which generates the higher randomness corresponding to the whole plane.

Please note that, the spirit of the present invention is to provide a delay device and method for a random number generator to generate delayed input signal(s) for the random component(s) in the random number generator, in order to enhance the randomness. Those skilled in the art can make modifications or alternations accordingly. In other words, as long as the randomness of the random number generator can be enhanced by utilizing the spread of delay times for the trigger signals received by the random number generator(s), any modifications or alternations can be performed according to system requirements, which are still within the scope of the present invention. For example, a random number generator may include any numbers of random components according to randomness requirements of the system, which is not limited herein.

Figure 10:
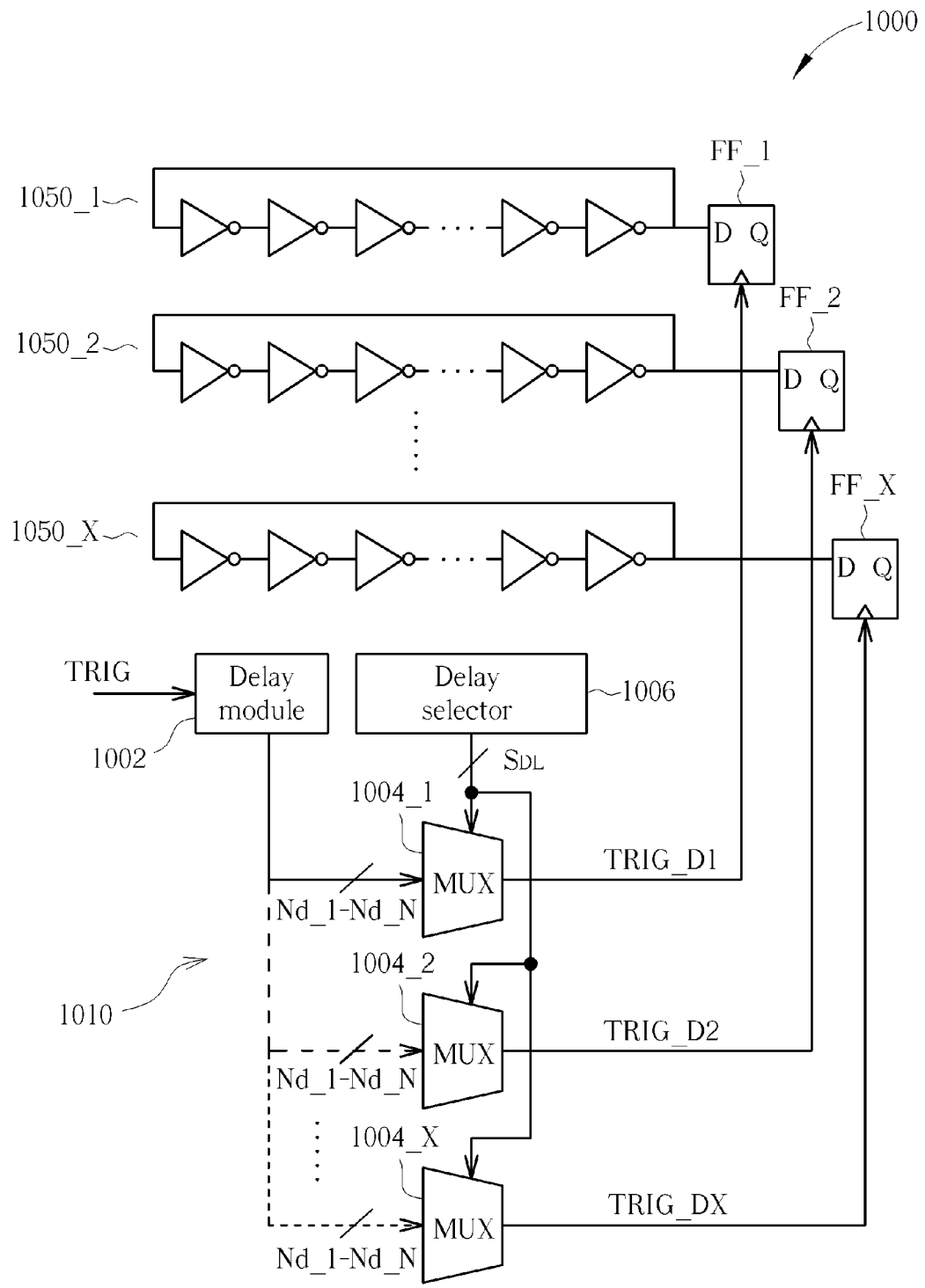
FIG. 10 is a schematic diagram of a random number generator according to an embodiment of the present invention.

In addition, the random components of the above embodiments can also be realized by using ring oscillators. Please refer to FIG. 10, which is a schematic diagram of a random number generator 1000 according to an embodiment of the present invention. As shown in FIG. 10, the random number generator 1000 includes a delay device 1010, random components 1050_1-1050_X, and flip-flops FF_1-FF_X. The delay device 1010 includes a delay module 1002, multiplexers 1004_1-1004_X, and a delay selector 1006. The structures and functions of the delay module 1002, the multiplexers 1004_1-1004_X, and the delay selector 1006 are similar to those of the delay module 902, the multiplexers 904_1-904_X, and the delay selector 906, respectively; hence signals related to these modules are denoted by the same symbols. The main difference between the random number generator 1000 and the random number generator 90 is that the random number generator 1000 utilizes the jitter-based random components 1050_1-1050_X (i.e. ring oscillators) as the entropy source. The outputs of the random components 1050_1-1050_X are sampled by the flip-flops FF_1-FF_X, respectively, to generator X pieces of random bits. The delayed trigger signals TRIG_D1-TRIG_DX generated by the delay device 1010 are received by the flip-flops FF_1-FF_X as the sampling clocks to sample the outputs of the random components 1050_1-1050_X, respectively. As a result, the outputs of the random components 1050_1-1050_X are sampled by the delayed sampling clocks with various delay times, which enhances the randomness of the random number generator 1000. In addition, the number of inverters utilized in each random component 1050_1-1050_X may also be various, such that the randomness can be enhanced much more. The detailed operations of the random number generator 1000 and the delay device 1010 are illustrated above, which will not be narrated herein.

Figure 11A:
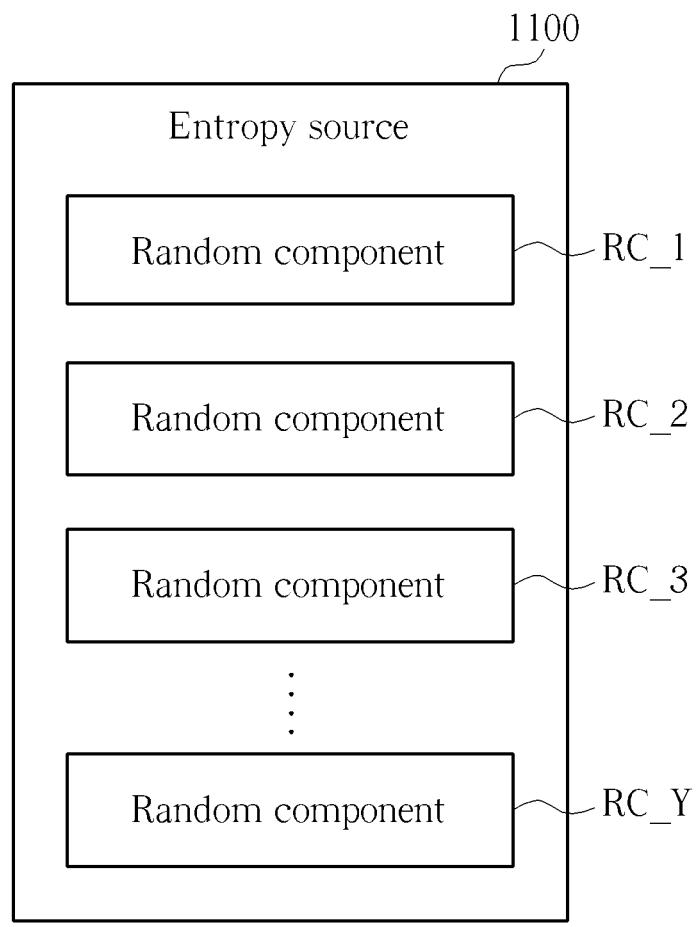
FIG. 11A is a schematic diagram of an entropy source of a conventional random number generator.
Figure 11B:
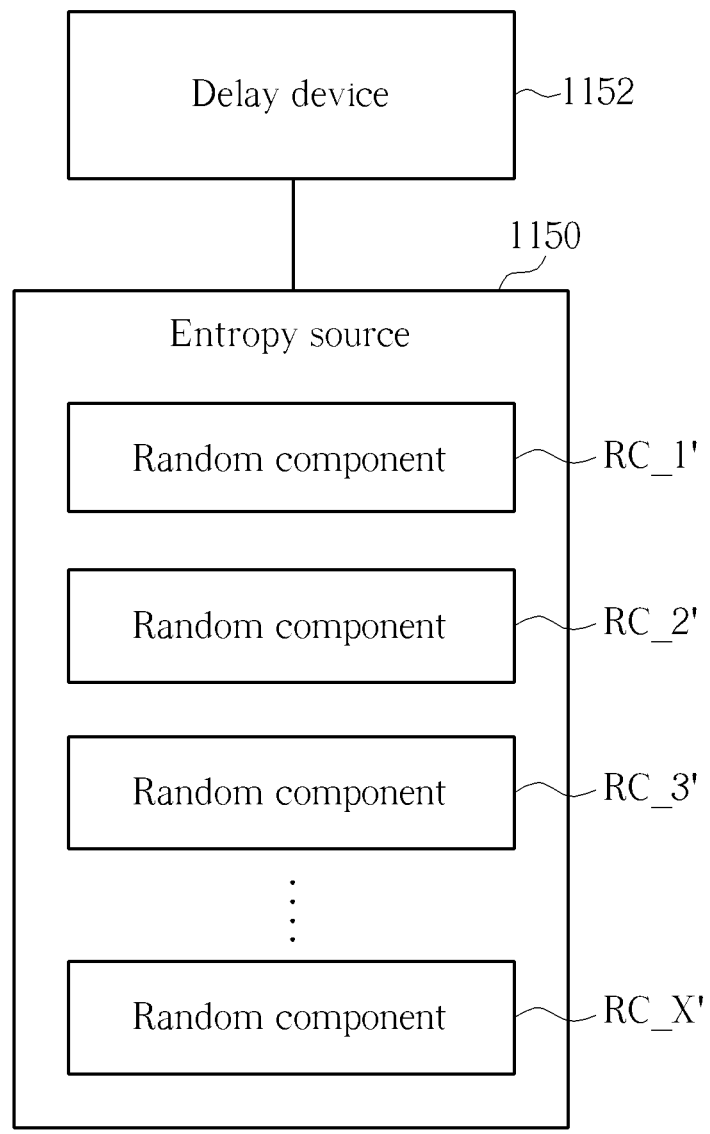
FIG. 11B is a schematic diagram of an entropy source together with a delay device in a random number generator according to an embodiment of the present invention.

According to the above embodiments of the present invention, higher randomness can be achieved with a proper number of random components, while the same randomness must be achieved by utilizing more random components in the prior art. Please refer to FIG. 11A and FIG. 11B, where FIG. 11A is a schematic diagram of an entropy source 1100 of a conventional random number generator, and FIG. 11B is a schematic diagram of an entropy source 1150 together with a delay device 1152 in a random number generator according to an embodiment of the present invention. The entropy source 1100 includes Y pieces of random components RC_1-RC_Y, while the entropy source 1150 includes X pieces of random components RC_1'-RC_X'. Supposing that all of the random components RC_1-RC_Y and RC_1'-RC_X' are the same, if the randomness of the entropy source 1100 is equal to that of the entropy source 1150, the number of the random components RC_1-RC_Y must be greater than the number of the random components RC_1'-RC_X', i.e. Y>X. As a result, in comparison with the conventional random number generator, the same randomness can be achieved with fewer random components according to the above embodiments of the present invention, which saves power consumption and circuit area, and sometimes the expenditure of time may also be saved. For example, if the system requires 32 random bits, the entropy source 1100 may use 32 random components (i.e. Y=32) for generating a random bit each cycle by combining 32 random outputs of the 32 random components (i.e. by using exclusive-or logic) in order to achieve enough randomness, and then repeat the process for 32 times in 32 cycles to generate the required 32 random bits. In comparison, the entropy source 1150 may only use one random component (i.e. X=1), which can generate a random bit with enough randomness in each cycle, and then the entropy source 1150 repeats the process for 32 times in 32 cycles to generate the required 32 random bits. In other exemplary embodiments, the entropy source 1150 may use 32 random bits (i.e. X=32), which can generate 32 random bits with enough randomness. At this moment, the expenditure of time for random bit generation is saved.

In the prior art, the entropy source of the conventional random number generator always utilizes a large quantity of random components and combines the output results of these random components in order to achieve higher randomness. This large quantity of random components may consume considerable power and large circuit area, and each of the standard logic cells possesses consistency to some extent, such that the randomness of the combination results of the homogeneous random components may not be satisfactory. In comparison, the present invention provides a delay device and method for the random number generator, which can generate delayed input signal(s) for the random component(s) in the random number generator. Therefore, in comparison with the conventional random number generator, the same randomness can be achieved with fewer random components according to the embodiments of the present invention, which saves power consumption and circuit area, and the expenditure of time for random bit generation can also be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay device for generating a signal for a random component in a random number generator, comprising:
   a delay module, for generating a plurality of delayed signals, wherein each delayed signal has a delay time and the delay time is different from each other;
   a first multiplexer, coupled to the delay module, for outputting a delayed signal among the plurality of delayed signals as a delayed trigger signal to control the random component to generate a random bit; and
   a delay selector, coupled to the first multiplexer, for generating a selecting signal to control the first multiplexer to select to output the delayed signal as the delayed trigger signal.

2. The delay device of claim 1, wherein the random number generator further comprises a random number generator control unit, for initializing the delay selector and generating a trigger signal for the delay module, such that the delay module delays the trigger signal to generate the plurality of delayed signals.

3. The delay device of claim 1, wherein the random component is a meta-stability based random component.

4. The delay device of claim 1, wherein the random component is a jitter based random component.

5. The delay device of claim 1, wherein the delay selector comprises a counter, for selecting the delayed signal in an order according to a type of the counter, to output the delayed trigger signal.

6. The delay device of claim 1, wherein the delay selector comprises a linear feedback shift register, for selecting the delayed signal in a pseudo-random sequence to output the delayed trigger signal.

7. The delay device of claim 6, wherein the linear feedback shift register is initialized according to a seed.

8. The delay device of claim 7, wherein the seed is generated by a random number generator control unit or the random component.

9. The delay device of claim 1, wherein the random number generator further comprises a determining unit, for determining whether a number of random bits generated by the random number generator reaches a predefined number of random bits required to be generated.

10. The delay device of claim 9, wherein the delay selector generates another selecting signal to control the first multiplexer to select to output another delayed signal as the delayed trigger signal to control the random component to generate another random bit when the determining unit determines the number of random bits does not reach the predefined number of random bits required to be generated.

11. A random number generator, comprising:
    a random component; and
    a delay device, for generating a signal for the random component, the delay device comprising:
       a delay module, for generating a plurality of delayed signals, wherein each delayed signal has a delay time and the delay time is different from each other;
       a first multiplexer, coupled to the delay module, for outputting a delayed signal among the plurality of delayed signals as a delayed trigger signal to control the random component to generate a random bit; and
       a delay selector, coupled to the first multiplexer, for generating a selecting signal to control the first multiplexer to select to output the delayed signal as the delayed trigger signal.

12. The random number generator of claim 11, further comprising a random number generator control unit, for initializing the delay selector and generating a trigger signal for the delay module, such that the delay module delays the trigger signal to generate the plurality of delayed signals.

13. The random number generator of claim 11, wherein the random component is a meta-stability based random component.

14. The random number generator of claim 11, wherein the random component is a jitter based random component.

15. The random number generator of claim 11, wherein the delay selector comprises a counter, for selecting the delayed signal in an order according to a type of the counter, to output the delayed trigger signal.

16. The random number generator of claim 11, wherein the delay selector comprises a linear feedback shift register, for selecting the delayed signal in a pseudo-random sequence to output the delayed trigger signal.

17. The random number generator of claim 16, wherein the linear feedback shift register is initialized according to a seed.

18. The random number generator of claim 17, wherein the seed is generated by a random number generator control unit or the random component.

19. The random number generator of claim 11, further comprising a determining unit, for determining whether a number of random bits generated by the random number generator reaches a predefined number of random bits required to be generated.

20. The random number generator of claim 19, wherein the delay selector generates another selecting signal to control the first multiplexer to select to output another delayed signal as the delayed trigger signal to control the random component to generate another random bit when the determining unit determines the number of random bits does not reach the predefined number of random bits required to be generated.

21. A random number generator, comprising:
   a plurality of random components; and
   a delay device, for generating a signal for each of the plurality of random components, the delay device comprising:
      a delay module, for generating a plurality of delayed signals, wherein each delayed signal has a delay time and the delay time is different from each other;
      a plurality of first multiplexers, each coupled to the delay module, for outputting a delayed signal among the plurality of delayed signals as a delayed trigger signal to control each random component among the plurality of random components to generate a random bit; and
      a delay selector, coupled to the plurality of first multiplexers, for generating a selecting signal to control each of the plurality of first multiplexers to select to output the delayed signal as the delayed trigger signal.

22. The random number generator of claim 21, further comprising a random number generator control unit, for initializing the delay selector and generating a trigger signal for the delay module, such that the delay module delays the trigger signal to generate the plurality of delayed signals.

23. The random number generator of claim 21, wherein each of the plurality of random components is a meta-stability based random component.

24. The random number generator of claim 23, wherein the delay selector comprises a counter, for selecting the delayed signal in an order according to a type of the counter, to output the delayed trigger signal.

25. The random number generator of claim 21, wherein each of the plurality of random components is a jitter based random component.

26. The random number generator of claim 21, wherein the delay selector comprises a linear feedback shift register, for selecting the delayed signal in a pseudo-random sequence to output the delayed trigger signal.

27. The random number generator of claim 26, wherein the linear feedback shift register is initialized according to a seed.

28. The random number generator of claim 27, wherein the seed is generated by a random number generator control unit or the plurality of the random components.

29. The random number generator of claim 21, wherein the delayed trigger signal is selected in different manners by each of the plurality of first multiplexers to control each of the plurality of random components.

30. The random number generator of claim 29, wherein the plurality of first multiplexers are coupled to the delay module in different manners, for each of the plurality of first multiplexers to select the delayed trigger signal in different manners to control each of the plurality of random components.

31. The random number generator of claim 21, further comprising a determining unit, for determining whether a number of random bits generated by the random number generator reaches a predefined number of random bits required to be generated.

32. The random number generator of claim 31, wherein the delay selector generates another selecting signal to control the first multiplexer to select to output another delayed signal as the delayed trigger signal to control the random component to generate another random bit when the determining unit determines the number of random bits does not reach the predefined number of random bits required to be generated.

33. A method of generating a signal for a random component in a random number generator, comprising:
   generating a plurality of delayed signals, wherein each delayed signal has a delay time and the delay time is different from each other; and
   generating a selecting signal to select to output a delayed signal among the plurality of delayed signals as a delayed trigger signal, to control the random component to generate a random bit.

34. The method of claim 33, further comprising initializing a selection of the delayed trigger signal and generating a trigger signal for generating the plurality of delayed signals.

35. The method of claim 33, wherein the step of generating the selecting signal to select to output the delayed signal among the plurality of delayed signals as the delayed trigger signal comprises generating the selecting signal to select the delayed signal in an order according to a type of a counter, to output the delayed trigger signal.

36. The method of claim 33, wherein the step of generating the selecting signal to select to output the delayed signal among the plurality of delayed signals as the delayed trigger signal comprises generating the selecting signal to select the delayed signal in a pseudo-random sequence by using a linear feedback shift register, to output the delayed trigger signal.

37. The method of claim 36, wherein the linear feedback shift register is initialized according to a seed.

38. The method of claim 37, wherein the seed is generated by a random number generator control unit or the random component.

39. The method of claim 33, further comprising determining whether a number of random bits generated by the random number generator reaches a predefined number of random bits required to be generated.

40. The method of claim 39, wherein another selecting signal is generated to select to output another delayed signal as the delayed trigger signal to control the random component to generate another random bit when determining the number of random bits does not reach the predefined number of random bits required to be generated.

* * * * *